United States Patent [19]
Bang

[11] Patent Number: 5,949,143
[45] Date of Patent: Sep. 7, 1999

[54] SEMICONDUCTOR INTERCONNECT STRUCTURE WITH AIR GAP FOR REDUCING INTRALAYER CAPACITANCE IN METAL LAYERS IN DAMASCENE METALIZATION PROCESS

[75] Inventor: David Bang, Palo Alto, Calif.

[73] Assignee: Advanced Micro Devices, Inc., Synnyvale, Calif.

[21] Appl. No.: 09/012,006

[22] Filed: Jan. 22, 1998

[51] Int. Cl.$^6$ .................................................. H01L 23/48
[52] U.S. Cl. ............................................ 257/758; 257/522
[58] Field of Search .................................. 257/522, 758, 257/640, 641, 649, 760, 347, 350, 351, 638

[56] References Cited

U.S. PATENT DOCUMENTS

| | | | |
|---|---|---|---|
| 5,310,700 | 5/1994 | Lien et al. | 257/758 |
| 5,324,683 | 6/1994 | Fitch et al. | 438/422 |
| 5,476,817 | 12/1995 | Numata | 438/619 |
| 5,641,712 | 6/1997 | Grivna et al. | 438/624 |
| 5,668,398 | 9/1997 | Havemann et al. | 257/522 |

OTHER PUBLICATIONS

Fleming et al. "Use of Air Gap Structures to Lower Intralevel Capacitance", DUMIC Conference, Feb. 10–11, 1997, pp. 139–146.

*Primary Examiner*—Tom Thomas
*Assistant Examiner*—Thien F Tran
*Attorney, Agent, or Firm*—Foley & Lardner

[57] ABSTRACT

An interconnect structure capable of reducing intralevel capacitance in a damascene metalization process employs entrapped air gaps between metal lines. The structure comprises at least first and second metal regions separated by a dielectric region, an air gap formed at least partially within the dielectric region, a diffusion barrier positioned over the two metal regions covering a portion of the upper surface of the air gap, and an insulating layer positioned over the diffusion barrier sealing the upper surface of the air gap.

4 Claims, 3 Drawing Sheets

SEMICONDUCTOR INTERCONNECT STRUCTURE WITH AIR GAP FOR REDUCING INTRALAYER CAPACITANCE IN METAL LAYERS IN DAMASCENE METALIZATION PROCESS

BACKGROUND OF THE INVENTION

The invention is related to a method fabricating a semiconductor device with reduced intralayer capacitance between interconnect lines and a resulting semiconductor structure.

Intralayer (or intralevel) capacitance is a major obstacle in achieving higher levels of integration. Higher levels of integration require smaller distances between metal lines with the region between metal lines having correspondingly higher aspect ratios (i.e., the ratio between the gap height and gap width). With the continual improvement in reduction of metallic line widths to the submicron range, interconnect delays become an increasing problem because of parasitic capacitance between the interconnect lines.

Several techniques have been utilized to reduce the dielectric constant between spacings of metal lines. Some proposals utilize interposed inorganic spin-on materials having low dielectric constants as, for example, hydrogen silsesquioxane (HSQ) or fluorinated silicon dioxides. However, these methods are successful only in reducing the dielectric constant to approximately 3.0 and involve complicated and expensive processing steps. Moreover, the resulting dielectric constants are not as low as desired especially with the continual push for higher integration resulting in ever higher aspect ratios.

An alternative method is to utilize an air gap between neighboring metallic lines so as to achieve the dielectric constant of approximately one. A conventional method utilizing an air gap interposed between adjacent metal lines is shown in FIGS. 1–4. Reference is also made to prior U.S. Pat. No. 5,641,712 and the article by J. G. Fleming and E. Roherty-Osmun entitled "Use of Air Gap Structures to Lower Intralevel Capacitance," Feb. 10-11, 1997 DUMIC Conference, both of which documents are incorporated herein by reference.

FIG. 1 illustrates a portion of an interconnect structure 10 showing a silicon dioxide layer 12, a metalized layer such as aluminum 14, and a patterned photoresist layer 16. The interconnect structure 10 is formed on a semiconductor chip which is part of a semiconductor wafer. The metal layer 14 is etched away to form metal lines 20, 22 and 24, after which the photoresist layer 16 is stripped away with the resulting structure shown in FIG. 2. A dielectric 28 (e.g., SiO2) is now deposited over the structure of FIG. 2 in such a manner as to enclose air gaps 32 and 34 as shown in FIG. 3. The manner of depositing the dielectric layer 28 is known in the art as shown in the aforementioned U.S. Pat. No. 5,641,712 and may include inert ion sputtering and may be done with or without the formation of spacers. After the dielectric layer 28 is deposited a second dielectric layer 38 (e.g., HSQ) is utilized over dielectric layer 28. A second dielectric layer is typically planarized and the process may then be repeated.

While the above-described process is successful in entrapping air gaps between metal lines, the process may not be utilized to create air gaps when a damascene process is used for metalization.

SUMMARY OF THE INVENTION

The invention is directed to a method of creating air gaps or air voids between metal lines made using a damascene process. The resulting structure exhibits reduce parasitic (intralevel) capacitance and permits higher aspect ratio metalization layers to be used to achieve higher levels of integration.

The invention may be characterized as a method of reducing intralevel capacitance in a damascene metalization process using the steps of (a) forming a metalization pattern using a damascene process which includes forming at least first and second metal regions separated by a dielectric or electrically insulating region, (b) forming an air gap at least partially within the dielectric or electrically insulating region, and (c) sealing the air gap to entrap the air gap between the at least first and second metal regions thereby reducing intralevel capacitance between the at least first and second metal regions.

BRIEF DESCRIPTION OF THE INVENTION

FIGS. 1–4 illustrate cross sectional views of a conventional process for forming metal lines with entrapped air gaps; and FIGS. 5–13 illustrate cross sectional views of the formation of entrapped air gaps using a damascene metalization process in accordance with the principles of the invention.

DETAILED DESCRIPTION OF THE PREFERRED EMBODIMENTS

Figure 1:
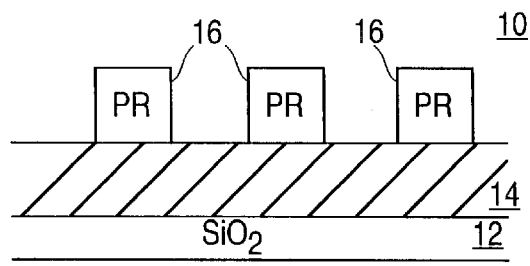
Figure 2:
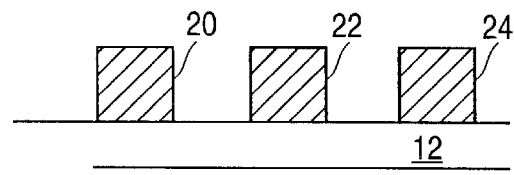
Figure 3:
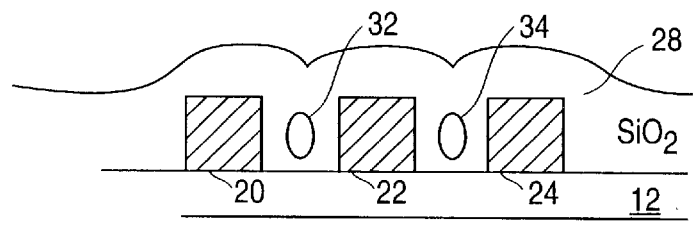
Figure 4:
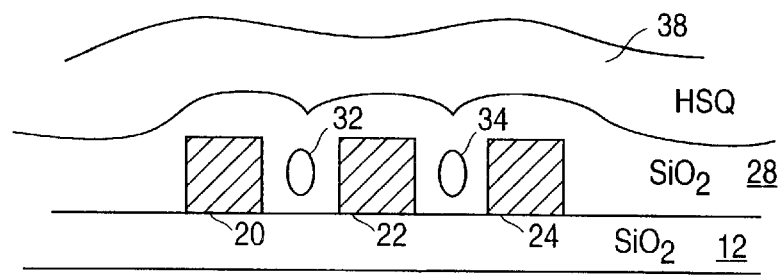
Figure 5:
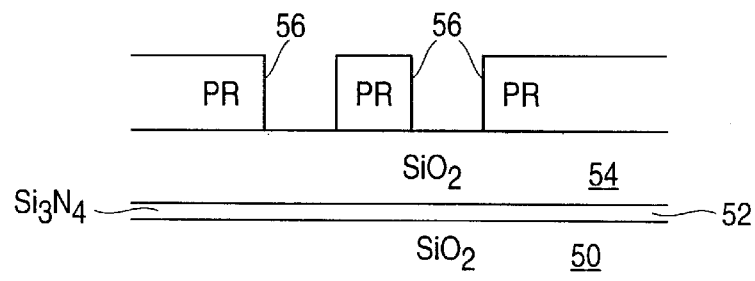
Figure 6:
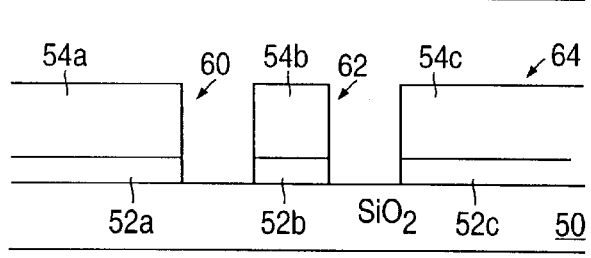
Figure 7:
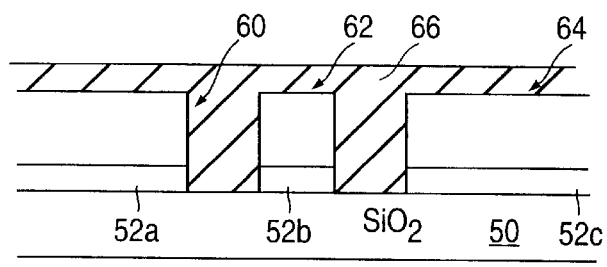
Figure 8:
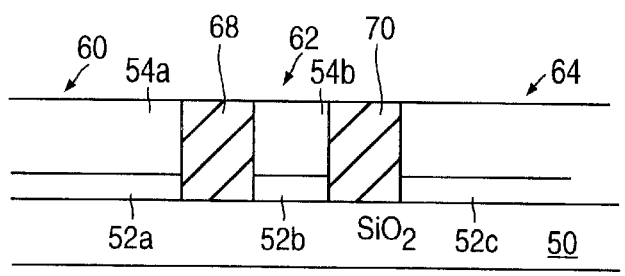

FIG. 5 illustrates a portion of an interconnect structure having a first electrically insulating or dielectric layer such as silicon dioxide (SiO2) layer 50, a second electrically insulating or dielectric layer such as a silicon nitride layer 52, and a third electrically insulating or dielectric layer such as an silicon dioxide (SiO2) layer 54. The silicon nitride layer 52 serves both as an etch stop as well as a diffusion barrier for the metal lines, typically copper. A photoresist 56 is exposed to a negative image to form a patterned photoresist layer on top of the oxide layer 54. The patterned photoresist negative image is then utilized in a two step process to anisotropically etch oxide layer 54 and silicon nitride layer 52 to expose oxide layer 50. The photoresist layer is then stripped away resulting in the patterned regions 60, 62 and 64, as shown in FIG. 6. Region 60 is composed of oxide layer 54a and silicon nitride layer 52a; region 62 is composed of oxide layer 54b and silicon nitride layer 52b; and region 64 is composed of oxide layer 54c and silicon nitride layer 52c. A metal layer 66 is then deposited over the patterned regions 60, 62 and 64 resulting in the structure shown in FIG. 7. The metal layer 66 is then polished (such as with a CMP process) to form metal lines 68 and 70, as shown in FIG. 8. The steps illustrated FIGS. 1–8 are conventionally used in a damascene metalization process.

Figure 9:
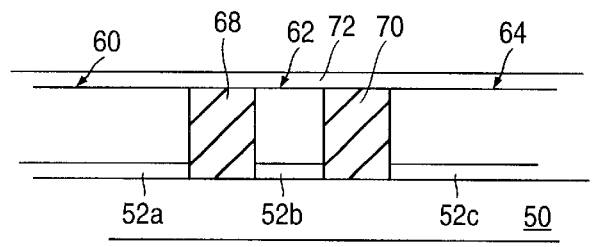

An etch stop layer 72 is then deposited over the structure of FIG. 8 resulting in the structure shown in FIG. 9. The etch stop may be silicon nitride or other conventional etch stop. Silicon nitride is preferable because it also serves as a diffusion barrier for the metal lines 68 and 70 which are generally made of copper.

Figure 10:
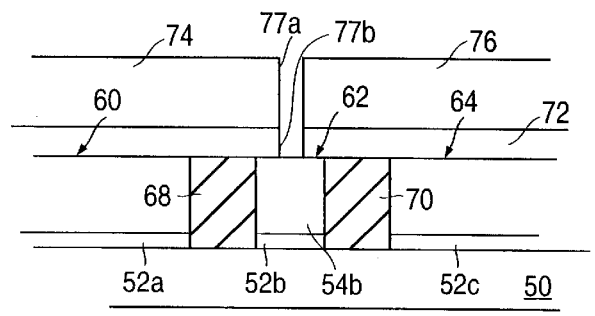

As shown in FIG. 10, a photoresist is patterned over the etch stop layer 72 (patterns 74 and 76) to form a channel 77a which leaves part of the etch stop 72 areas exposed which are directly over the oxide layers interposed between adjacent metal lines (i.e., oxide layer 54b interposed between metal lines 68 and 70). The etch stop layer 72 is then etched away resulting in an aperture or channel 77b as shown in FIG. 10. The photoresist patterns 74 and 76 are then stripped away resulting in the structure shown in FIG. 11.

Figure 11:
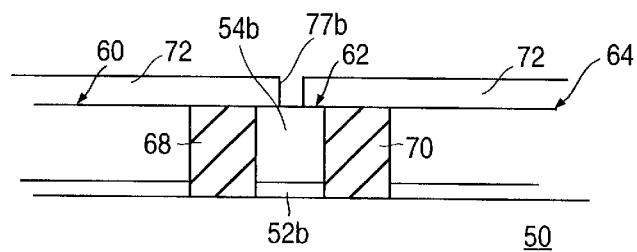

In reference to FIG. 11, metal lines 68 and 70 are separated by the patterned region 62, which includes a portion 54b of the original dielectric layer 54, and a portion 52b of the original dielectric layer 52. The surface of the oxide layer 54b is exposed to the atmosphere through the channel 77b.

Figure 12:
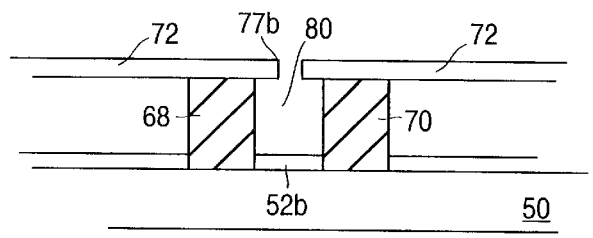

The oxide portion 54b is then etched away to leave an air void 80 as illustrated in FIG. 12. While FIG. 12 illustrates that the entire oxide portion 54b is etched away and thus removed between metal line 68 and 70, it is clear that a portion of the oxide layer 54b may be removed to produce a somewhat smaller air gap which would still be effective in reducing the intralevel capacitance in accordance with the principles of the invention. Preferably, the etch will have a high etch selectively for SiO2 as compared with Si3N4 so that the silicon nitride will serve as an etch stop. As non-limiting examples, the etching may be carried out isotropically using wet chemical etching of one part hydrofluoric acid diluted in six parts ammonium fluoride (1:6 HF:NH4F) or by using equal parts of acetic acid, ammonium fluoride and water.

Figure 13:
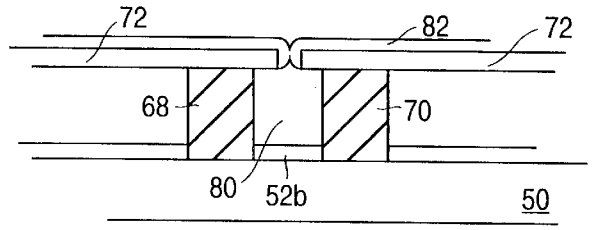

The etching may also be carried out anisotropically to etch partially or completely through the dielectric region 52b and further may be overetched to extend partially or fully into the oxide layer 50 so that the void extend below the lower surface of the metal lines 68 and 70 thereby reducing fringing capacitance. Finally, the air gap 80 is sealed as, for example, by depositing an electrically insulating layer such as an silicon dioxide layer 82 over the channel 77b and at least a portion of the interconnect structure adjacent the channel 77b as shown in FIG. 13. The air gap 80 is thus enclosed between the metal lines 68 and 70. Prior to sealing, moisture may be driven out of the area of the air gap by heating the interconnect structure 10. The air (or more generally ambient gas) within the air gap 80 is typically of low pressure and may be on the order of 100 militorr. After sealing, a sputtering etch may be used to reshape the nip in the region of the oxide layer 82 over the air gap as an aid in the conformal deposition of subsequent layers if desired.

It is noted that the oxide layer 82 may be replaced by another etch stop layer which may then subsequently be overlaid with a silicon dioxide layer. The entire process may be repeated starting at FIG. 5 to form a multi-layer metalization structure.

As non-limiting examples of the dimensions which may be fabricated utilizing embodiments of the invention, the channel 77b may be 0.25 µm wide with the width of the oxide region 54b being 0.35 µm and the width of the metalization lines (lines 68 and 70) begin on the order of 0.5 µm. A relatively small opening or channel 77b is desired to permit facile sealing of the air gap and to minimize the amount of sealing material (e.g., SiO2) that will be deposited into the air gap region in the sealing process. A person of skill in the art will recognize that the metal lines 68 and 70 may be any suitable interconnect material such as, but not limited to, copper, aluminum, titanium, silicon, tungsten, gold, tin and lead. The dielectric layer 54 is illustrated as SiO2, but may comprise any suitable electrically insulating layer such as nitrides or oxides as, for example, those formed from silane source gas. Low/k (dielectric constant) organic polymers may also be used.

While not illustrated, the oxide layer 50 is deposited on a substrate such as silicon. The substrate may, however, be any semiconductor material such as silicon germanium, silicon carbide, gallium arsenide, indium phosphide etc. It is further apparent that the embodiments of the invention may be applicable to dual damascene processes wherein air gaps or voids are created to reduce intralevel capacitance. For purposes of defining the invention, a damascene process is intended to include dual damascene (and higher iterations) processes.

It is further noted that while the term air gap or air void is used herein, the chemical constituents of the "air gap" will be dictated by the ambient atmosphere associated with the particular type of sealing process used. Typically reduced pressures will be associated with such sealing processes.

While the invention has been described in reference to particular embodiments as set forth above, many modifications and alternatives will become apparent to one of skill in the art without departing from the principles of the invention as defined by the appended claims.

What is claimed is:

1. A semiconductor structure comprising:

a. a semiconductor substrate b. a first electrically insulating layer covering a portion of an upper surface of said substrate c. a first diffusion barrier positioned on a part of an upper surface of said first electrically insulating layer d. a metalization pattern positioned on a different part of said upper surface of said first electrically insulating layer, said metalization pattern comprising at least two spaced apart metal lines, e. a second diffuasion barrier, positioned over said at least two metal lines, and having an opening less than the spacing between the metal lines, f. a second electrically insulating layer, positioned over said second diffusion barrier, g. a region between said at least two metal lines containing an air gap comprising an ambient gas having a relatively low dielectric constant, and h. said second electrically insulating layer sealing an upper surface of said air gap by extending into and filling said opening of said second diffusion barrier so as to prevent ambient gas flow therethrough, said second electrically insulating layer not extending substantially into said air gap.

2. A semiconductor structure as recite in claim 1 wherein said first and second diffusion barriers comprise silicon nitride.

3. A semiconductor structure as recite in claim 1 wherein said first and second electrically insulating layers comprise silicon dioxide.

4. A semiconductor structure as recite in claim 2 wherein said first and second electrically insulating layers comprise silicon dioxide.

* * * * *

UNITED STATES PATENT AND TRADEMARK OFFICE
CERTIFICATE OF CORRECTION

PATENT NO. : 5,949,143
DATED : September 7, 1999
INVENTOR(S) : David BANG.

It is certified that error appears in the above-identified patent and that said Letters Patent is hereby corrected as shown below:

Column 4, line 35, delete "diffuasion" and replace with --diffusion--;

Column 4, line 49, insert after gap --, and said second diffusion barrier covering a portion of an upper surface of said air gap --;

Column 4, line 50, delete "recite" and replace with --recited--;

Column 4, line 53, delete "recite" and replace with --recited--;

Column 4, line 56, delete "recite" and replace with --recited--.

Signed and Sealed this

Tenth Day of April, 2001

Attest:

NICHOLAS P. GODICI

Attesting Officer     Acting Director of the United States Patent and Trademark Office